(12) United States Patent
Huang

(10) Patent No.: US 6,272,008 B1
(45) Date of Patent: Aug. 7, 2001

(54) APPARATUS CASING QUICK MOUNTING ARRANGEMENT

(75) Inventor: Meng-Chou Huang, Taipei (TW)

(73) Assignee: First International Computer, Inc., Taipei (TW)

( * ) Notice: Subject to any disclaimer, the term of this patent is extended or adjusted under 35 U.S.C. 154(b) by 0 days.

(21) Appl. No.: 09/384,408

(22) Filed: Aug. 27, 1999

(51) Int. Cl.⁷ ........................................ G06F 1/20
(52) U.S. Cl. .................. 361/683; 361/679; 361/684; 361/685; 361/686
(58) Field of Search ............ 361/679, 683–686

(56) References Cited

U.S. PATENT DOCUMENTS 5,121,296 * 6/1992 Hsu ................................. 361/395
6,025,987 * 2/2000 Allirot et al. .................... 361/685

* cited by examiner

*Primary Examiner*—Leo P. Picard
*Assistant Examiner*—Yean-Hsi Chang
(74) *Attorney, Agent, or Firm*—Rosenberg, Klein & Lee

(57) ABSTRACT

An apparatus casing quick mounting arrangement, which includes a computer housing having an apparatus insertion slot and a plurality of locating holes at a top flange above the apparatus insertion slot and at least one elongated guide hole, an apparatus casing mounted in the computer housing in alignment with the apparatus insertion slot to hold a computer peripheral apparatus, the apparatus casing having at least one locating strip slidably hooked in the at least one elongated guide hole at the computer housing to guide the apparatus casing into position, and a spring plate mounted on the apparatus casing and coupled to the computer housing to secure the apparatus casing in position, the spring plate having an angled front mounting flange fixedly fastened to the apparatus casing at a top side, and hooked portions raised from a free end thereof at a top side and respectively engaged into the locating holes at the computer housing from a bottom side.

2 Claims, 4 Drawing Sheets

APPARATUS CASING QUICK MOUNTING ARRANGEMENT

BACKGROUND OF THE INVENTION

The present invention relates to an apparatus casing mounting arrangement for mounting an apparatus casing (for example, the casing for floppy diskdrive, hard diskdrive, or CD-ROM player) in a computer housing, and more particularly to an apparatus casing quick mounting arrangement, which enables an apparatus casing to be quickly and detachably installed without the use of a hand tool.

According to conventional mounting techniques, screws are commonly used to fix the casing of a computer peripheral apparatus, for example, a floppy diskdrive, hard diskdrive, or DC-ROM player in a computer housing. When fixing screws, a screwdriver shall be used. This apparatus casing mounting procedure is complicated and time consuming, thereby causing the assembly cost of the computer to be relatively increased. Further, a hand tool, for example, a screwdriver shall be used when dismounting an installed apparatus casing from the computer housing.

SUMMARY OF THE INVENTION

The present invention has been accomplished to provide an apparatus casing quick mounting arrangement, which eliminates the aforesaid drawbacks. It is one object of the present invention to provide an apparatus casing quick mounting arrangement, which enables a computer peripheral apparatus casing to be quickly installed in a computer housing without the use of a hand tool. It is another object of the present invention to provide an apparatus casing quick mounting arrangement, which enables a computer peripheral apparatus casing to be quickly detachably fastened to the inside of a computer housing through a hook joint without the use of a hand tool. To achieve these and other objects of the present invention, there is provided a apparatus casing quick mounting arrangement, which comprises a computer housing having an apparatus insertion slot and a plurality of locating holes at a top flange above the apparatus insertion slot and at least one elongated guide hole, an apparatus casing mounted in the computer housing in alignment with the apparatus insertion slot to hold a computer peripheral apparatus, the apparatus casing having at least one locating strip slidably hooked in the at least one elongated guide hole at the computer housing to guide the apparatus casing into position, and a spring plate mounted on the apparatus casing and coupled to the computer housing to secure the apparatus casing in position, the spring plate having an angled front mounting flange fixedly fastened to the apparatus casing at a top side, and hooked portions raised from a free end thereof at a top side and respectively engaged into the locating holes at the computer housing from a bottom side.

DETAILED DESCRIPTION OF THE PREFERRED EMBODIMENT

Figure 1:
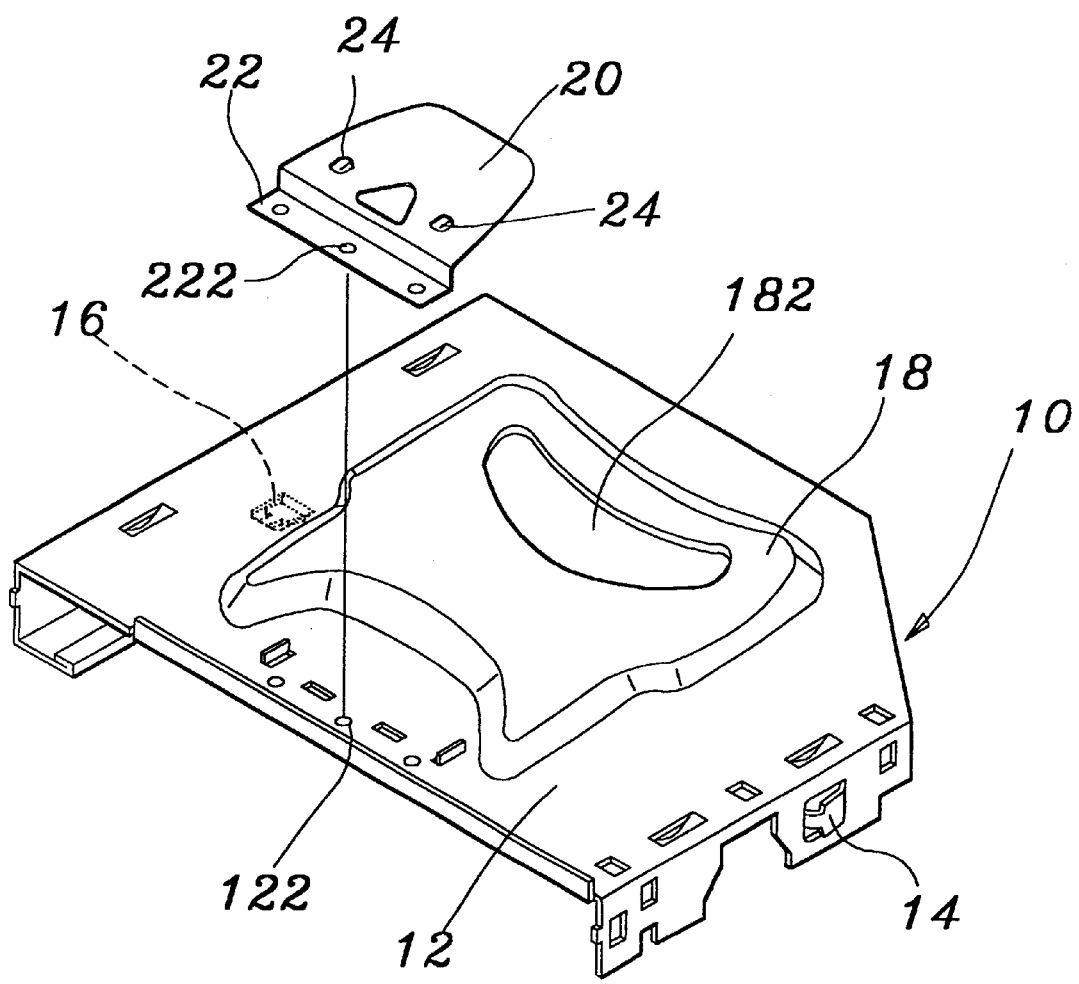
FIG. 1 is an exploded view of an apparatus casing and a spring plate according to the present invention.

Referring to FIG. 1, an apparatus casing 10 is shown for holding, for example, a CD-ROM player, and a spring plate 20 is fastened to the top side wall 12 of the apparatus casing 10 near the front side for mounting. The spring plate 20 comprises an angled front mounting flange 22 extended vertically downwards from its front side and then turned horizontally forwards, a plurality of, for example three through holes 222 transversely aligned at the horizontally forwardly extended front part of the front mounting flange 22. The apparatus casing 10 comprises three screw holes 122 transversely aligned at the top side wall 12 near the front side. The through holes 222 of the front mounting flange 22 are respectively fastened to the screw holes 122 at the apparatus casing 10 by a respective screw. After installation, the major part of the spring plate 20 is suspended above the top side wall 21 of the apparatus casing 10. Instead of the aforesaid mounting arrangement, the angled front mounting flange 22 of the spring plate 20 can be directly welded to the top side wall 12 of the apparatus casing 10. The spring plate 20 further comprises two hooked portions 24 raised from the top side wall of the free end thereof.

Figure 2:
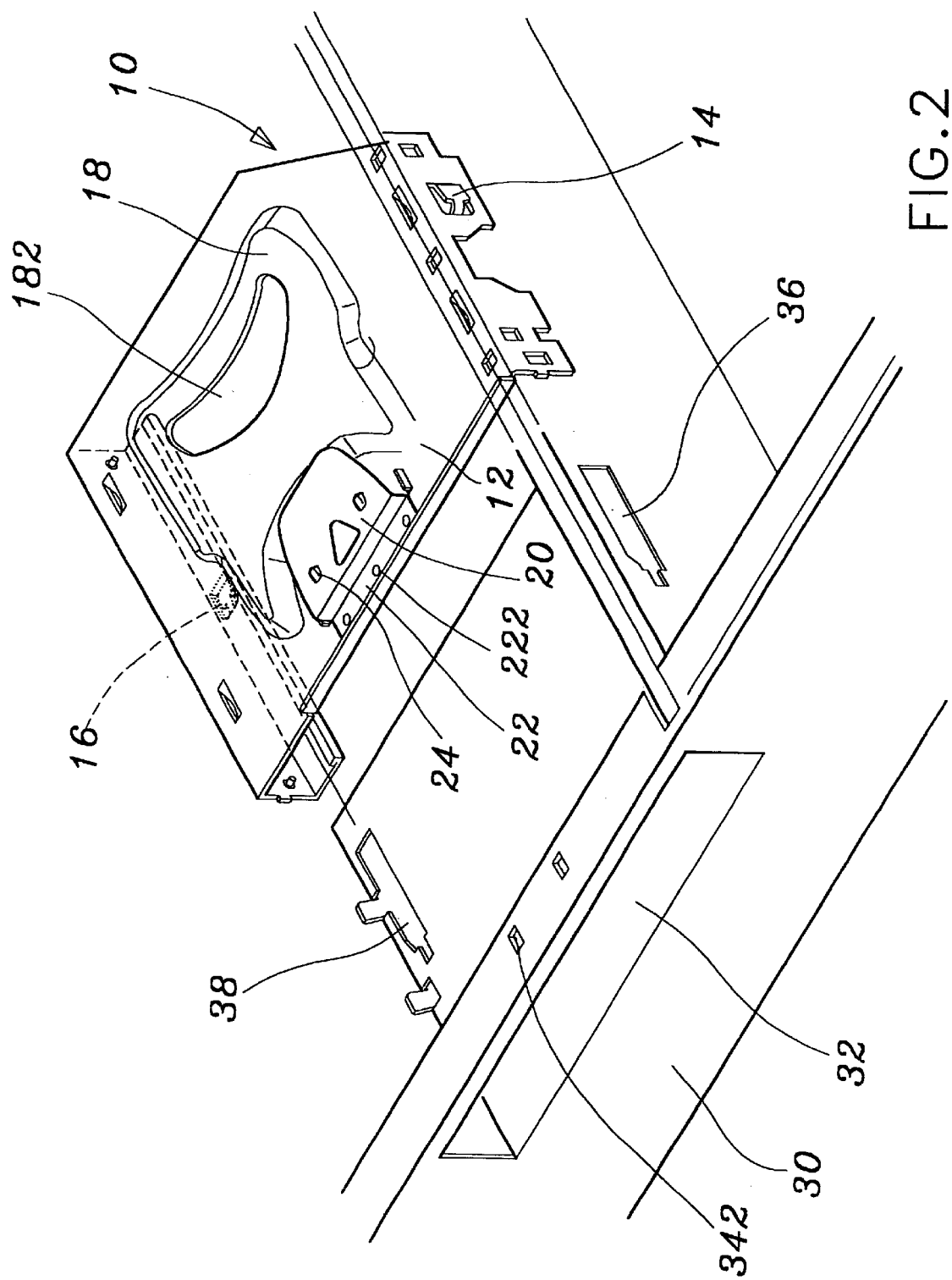
FIG. 2 is a perspective view showing the assembly of the apparatus casing and spring plate put in a computer housing.

Referring to FIG. 2 and FIG. 1 again, the computer housing 30 comprises a CD-ROM player mounting slot 32, two locating holes 342 at a flange 34 above the slot 32, a first longitudinally extended guide hole 36 at one vertical partition wall thereof, and a second longitudinally extended guide hole 38 at a bottom side wall thereof. The guide holes 36 and 38 each have a narrow front retaining end. The apparatus casing 10 comprises a first locating strip 14 and a second locating strip 16 respectively raised from two opposite side flanges thereof corresponding to the first longitudinally extended guide hole 36 and second longitudinally extended guide hole 38 at the computer housing 30.

Figure 3:
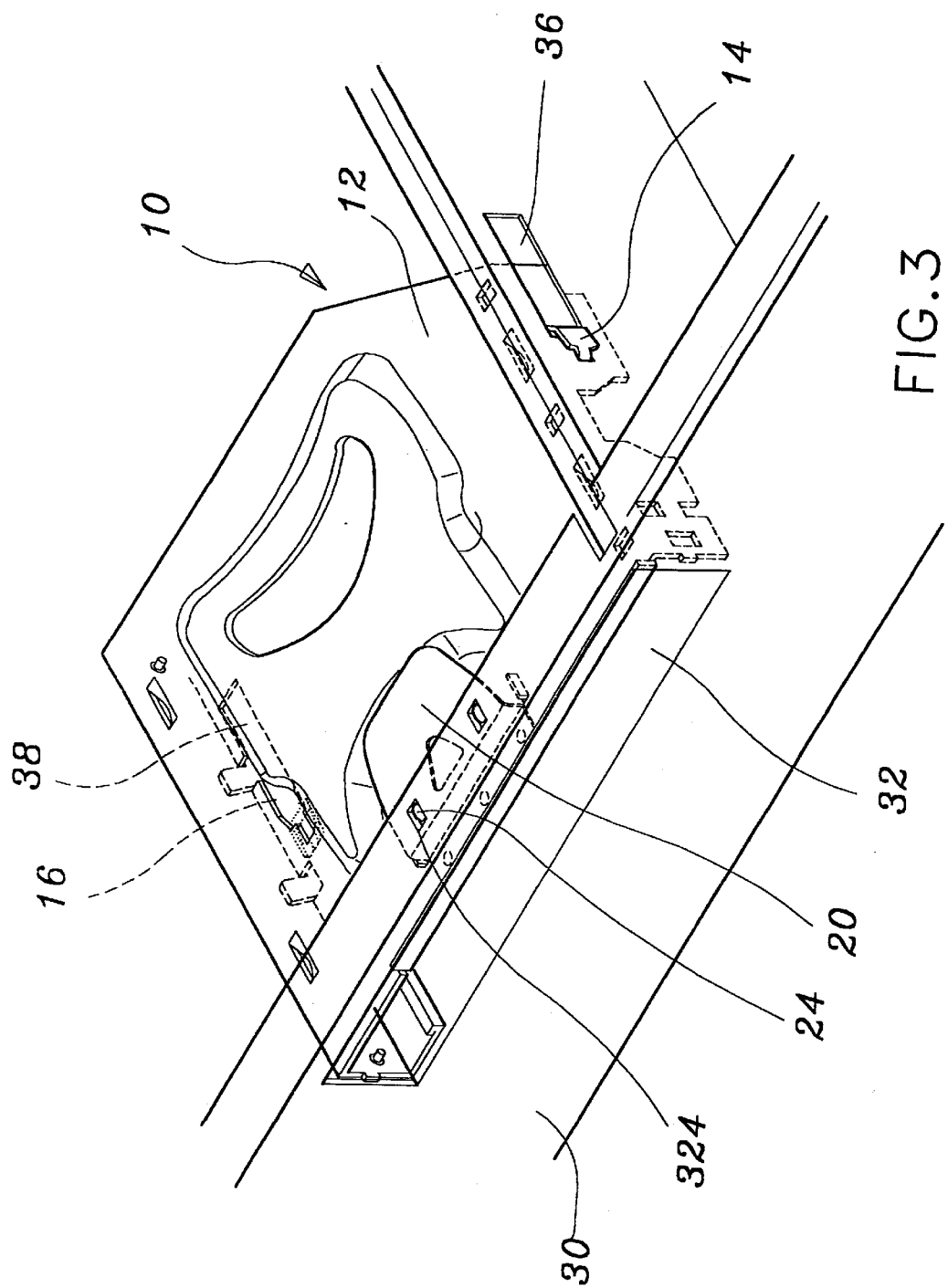
FIG. 3 is similar to FIG. 2 but showing the assembly of the apparatus casing and spring plate fixed to the computer housing.

Referring to FIG. 3 and FIG. 2 again, after installation of a CD-ROM player in the apparatus casing 10, the apparatus casing 10 is put in the computer housing 30 with the spring plate 20 aimed at the CD-ROM player mounting slot 32, then the apparatus casing 10 is pushed forwards to force the first locating strip 14 and the second locating strip 16 into the first longitudinally extended guide hole 36 and second longitudinally extended guide hole 38 respectively. When continuously pushing the apparatus casing 10 forwards, the first locating strip 14 and the second locating strip 16 are respectively forced into engagement with the narrow front retaining end of each of the first longitudinally extended guide hole 36 and second longitudinally extended guide hole 38, and at the same time the hooked portions 24 of the spring plate 20 are respectively engaged into the locating holes 342 at the flange 34 of the computer housing 30, and therefore the apparatus casing 10 is firmly secured to the computer housing 30. When removing the apparatus casing 10 from the computer housing 30, the spring plate 20 is pressed down to disengage the hooked portions 24 of the spring plate 20 from the locating holes 342 at the computer housing 30, and then the apparatus casing 10 is pushed backwards to disengage the first locating strip 14 and the second locating strip 16 from the first longitudinally extended guide hole 36 and second longitudinally extended guide hole 38.

Referring to FIG. 1 again, the top side wall 12 of the apparatus casing 10 comprises a convex portion 18, and a hand hole 182 at the convex portion 18. By inserting fingers into the hand hole 182, the apparatus casing 10 can be carried with the hand.

Figure 4:
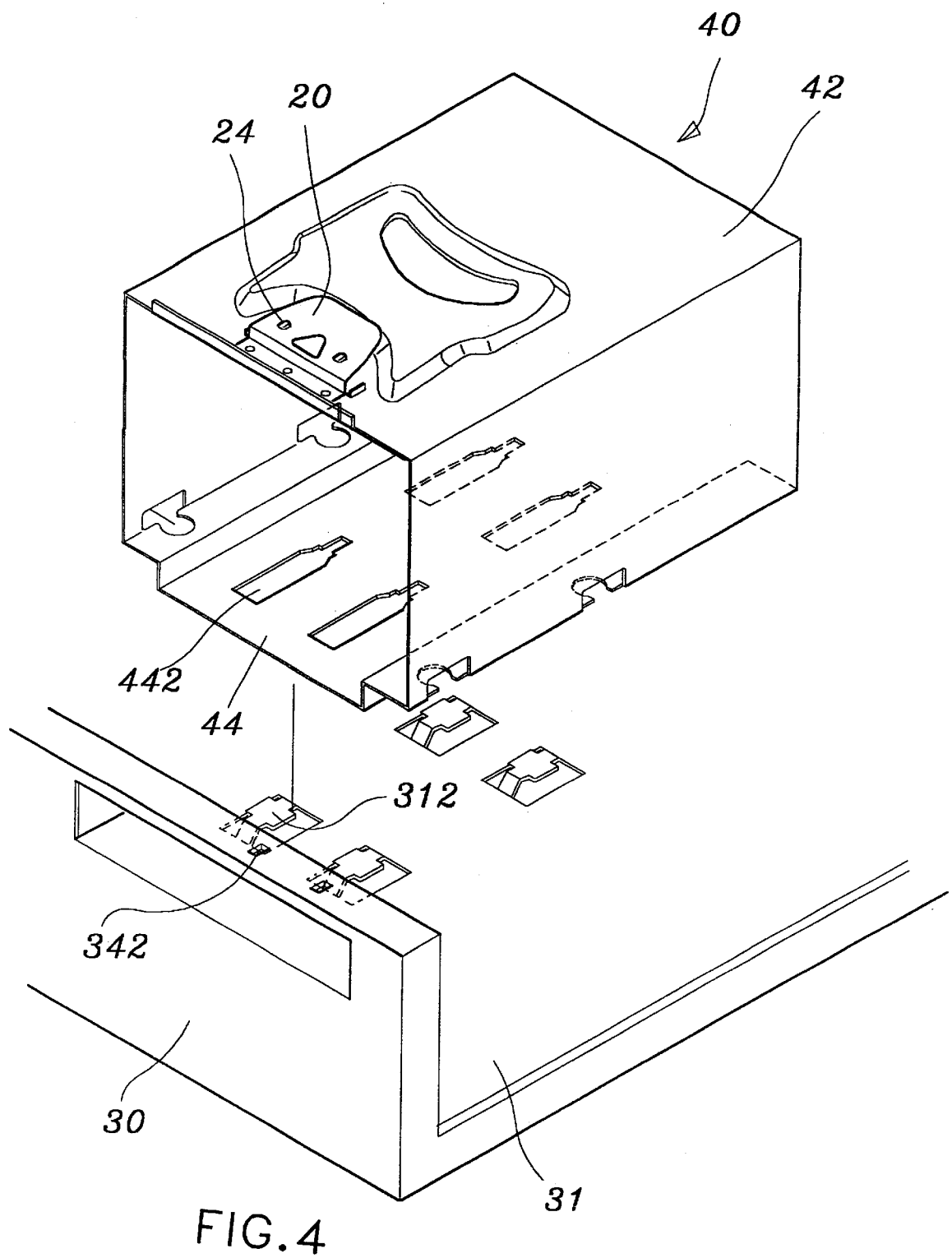
FIG. 4 shows an alternate form of the present invention.

FIG. 4 shows an alternate form of the present invention. According to this embodiment, the apparatus casing, referenced by 40, comprises a suspended spring plate 20 raised from the top side wall 40 thereof near the front side, and a plurality of longitudinally extended guide holes 442 at the bottom side wall 44 thereof. The spring plate 20 comprises hooked portions 24 raised from the top side wall thereof. When the apparatus casing 40 is put in the computer housing 30 and pushed forwards, the hooked portions 24 of the spring plate 20 are respectively engaged into respective locating holes 342 at the top flange of the computer housing 30, and the longitudinally extended guide holes 442 of the apparatus casing 40 are respectively forced into engagement with respective locating strips 312 at the bottom wall 31 of the computer housing 30. By pressing down the spring plate 20 to disengage the hooked portions 24 from the respective locating holes 342 and then pushing the apparatus casing 40 backwards, the apparatus casing 40 is disengaged from the hooks 312 at the bottom wall 31 of the computer housing 30.

As indicated above, the present invention provides an apparatus casing with a spring plate at the top. The spring plate has hooked portions raised from the top side wall of the free end thereof. When the apparatus casing is put in the computer housing and pushed forwards to the corresponding apparatus insertion slot, the hooked portions are respectively forced into engagement with respective locating holes at a top flange above the apparatus insertion slot, and therefore the apparatus casing is quickly installed. Further, elongated guide holes are provided at the computer housing for receiving respective hooks at the apparatus casing to guide the apparatus casing, enabling the apparatus casing to be quickly and positively set into position. Alternatively, hooks are provided at the apparatus casing, and elongated guide holes may be provided at the computer housing for receiving the hooks at the apparatus casing to guide the apparatus casing into position.

It is to be understood that the drawings are designed for purposes of illustration only, and are not intended for use as a definition of the limits and scope of the invention disclosed.

What the invention claimed is:

1. An apparatus casing quick mounting arrangement comprising:
    a computer housing, said computer housing having a plurality of locating holes formed through a top flange above an apparatus insertion slot thereof;
    an apparatus casing mounted in said computer housing in alignment with said apparatus insertion slot to hold a computer peripheral apparatus, said apparatus casing having a convex portion raised from a top side wall thereof, and a hand hole formed in said convex portion; and,
    a spring plate mounted on said apparatus casing and coupled to said computer housing to secure said apparatus casing in position, said spring plate including (a) an angled front mounting flange fixedly fastened to said top side wall of said apparatus casing, and (b) a plurality of hooked portions raised from an upper surface of said spring plate adjacent a free end thereof and respectively engaged in said plurality of locating holes of said computer housing from a bottom side of said top flange.

2. An apparatus casing quick mounting arrangement comprising:
    a computer housing, said computer housing having a plurality of locating holes formed through a top flange above an apparatus insertion slot thereof, said computer housing including at least one locating strip raised from a bottom wall thereof;
    an apparatus casing mounted in said computer housing in alignment with said apparatus insertion slot to hold a computer peripheral apparatus, said apparatus casing having at least one elongated guide hole formed through a bottom side wall thereof and respectively forced into engagement with said at least one locating strip of said computer housing; and,
    a spring plate mounted on said apparatus casing and coupled to said computer housing to secure said apparatus casing in position, said spring plate including (a) an angled front mounting flange fixedly fastened to said top side wall of said apparatus casing, and (b) a plurality of hooked portions raised from an upper surface of said spring plate adjacent a free end thereof and respectively engaged in said plurality of locating holes of said computer housing from a bottom side of said top flange.

\* \* \* \* \*